United States Patent
Delage et al.

(10) Patent No.: US 6,858,509 B2
(45) Date of Patent: Feb. 22, 2005

(54) BIPOLAR TRANSISTOR WITH UPPER HETEROJUNCTION COLLECTOR AND METHOD FOR MAKING SAME

(75) Inventors: Sylvain Delage, Orsay (FR); Simone Cassette, Limours (FR); Didier Floriot, Montigny le Bretonneux (FR); Arnaud Girardot, Toulouse (FR)

(73) Assignee: Thales, Paris (FR)

( * ) Notice: Subject to any disclaimer, the term of this patent is extended or adjusted under 35 U.S.C. 154(b) by 144 days.

(21) Appl. No.: 10/149,433

(22) PCT Filed: Dec. 15, 2000

(86) PCT No.: PCT/FR00/03562
§ 371 (c)(1),
(2), (4) Date: Jun. 24, 2002

(87) PCT Pub. No.: WO01/48829
PCT Pub. Date: Jul. 5, 2001

(65) Prior Publication Data
US 2002/0190273 A1 Dec. 19, 2002

(30) Foreign Application Priority Data
Dec. 23, 1999 (FR) .......................................... 99 16400

(51) Int. Cl.⁷ ............................................ H01L 21/331
(52) U.S. Cl. ...................................................... 438/315
(58) Field of Search ................................ 438/312, 315, 438/334, 336, 318, 376, 320, 343, 350, 374, 377, 317, 309, 353, 354, 373, 364, 369, 372; 257/200, 552, 553, 193, 201, 198, 565, 586, 592

(56) References Cited

U.S. PATENT DOCUMENTS

| | | | |
|---|---|---|---|
| 5,194,403 A | 3/1993 | Delage et al. ............. | 437/184 |
| 5,411,632 A | 5/1995 | Delage et al. ............. | 156/652.1 |
| 5,668,388 A | 9/1997 | Delage et al. ............. | 257/197 |
| 5,689,212 A | 11/1997 | Floriot et al. ............. | 330/286 |
| 5,719,433 A | 2/1998 | Delage et al. ............. | 257/625 |
| 5,757,039 A * | 5/1998 | Delaney et al. ............. | 257/198 |
| 5,783,966 A * | 7/1998 | Hill et al. ............. | 257/571 |
| 6,031,255 A * | 2/2000 | Delage et al. ............. | 257/198 |
| 6,451,659 B1 * | 9/2002 | Delage et al. ............. | 438/312 |

FOREIGN PATENT DOCUMENTS

| | | |
|---|---|---|
| EP | 0 240 307 | 10/1987 |
| EP | 0 300 803 | 1/1989 |
| EP | 0 562 272 | 9/1993 |
| JP | 07 122573 | 5/1995 |

OTHER PUBLICATIONS

Yahamhata et al. "InP/InGaAs Collector–Up Heterojunction Bipolar Transistors Fabricated Using Fe–Ion Implantation", Conference Proceedings, Seventh International Conference on Indium Phosphide & Related Materials, IEEE, 1995 May 9–13, 1995. pp 652–655.*

* cited by examiner

Primary Examiner—W. David Coleman
(74) Attorney, Agent, or Firm—Oblon, Spivak, McClelland, Maier & Neustadt, P.C.

(57) ABSTRACT

A collector-up heterojunction bipolar transistor including, stacked on a substrate, an emitter layer, a base layer, and a collector layer. In this transistor the surface area of the base-emitter junction is of smaller dimensions than the surface area of the base-collector junction. Further, the material of the base layer exhibits a sensitivity of the electrical conductivity to ion implantation that is lower than the sensitivity of the electrical conductivity of the material of the emitter layer to the same ion implantation.

16 Claims, 13 Drawing Sheets

BIPOLAR TRANSISTOR WITH UPPER HETEROJUNCTION COLLECTOR AND METHOD FOR MAKING SAME

BACKGROUND OF THE INVENTION

1. Field of the Invention

The invention relates to a collector-up heterojunction bipolar transistor and its method of production.

The invention aims to enhance electron transport in heterojunction bipolar transistors (HBT) in collector-up topology, while ensuring a high production yield.

2. Description of the Background

The collector-up configuration is particularly beneficial in the case of a heterojunction bipolar transistor because of the low values of base-collector capacitance which it makes it possible to obtain by comparison with those encountered with a conventional topology, called emitter-up topology. The reduction in this junction capacitance especially makes it possible to enhance the UHF performance of this type of component.

In contrast, if a few specific precautions are not taken, parasitic injection of electrons into the extrinsic base areas appears in an HBT. These electrons are then picked up by the base contacts or recombine in the extrinsic base; which, in both cases, leads to a degradation of the transport factor in the base and thus heavily penalizes the current gain of the transistor. Certain solutions have already been applied to this problem, and especially in the case of collector-up HBTs fabricated with GaAlAs/GaAs or GaInP/GAs materials.

Thus Yamahata et al. describe, in a publication (IEEE Electron Device Letters, Vol. 14, No 4, April 1993) a GaAlAs/GaAs collector-up single heterojunction bipolar transistor (S-HBT) in which the emitter region situated above the extrinsic base is converted into a highly resistive layer by ion implantation. In this way, it gets around the parasitic injection of electrons mentioned above and, at the same time, enhances the current gain of the HBT thus produced.

FIG. 1 shows the manufacturing method used by Yamahata et al. In the first place, a metal collector contact is deposited on the epitaxial structure. It is used as a mask for etching the collector layer (FIG. 1a). The structure is then implanted with oxygen ions through the base with an energy which is determined so as to render the extrinsic emitter regions (FIG. 1b) electrically isolating. A zinc diffusion makes it possible to re-establish a sufficient level of p$^+$ doping of the base layer which was damaged during the ion implantation (FIG. 1c). The metal base contacts are then deposited. The base and emitter layers are then etched in order to deposit metal emitter contacts on an n$^+$ doped sub-emitter. The component thus produced exhibits low base-collector capacitance and a heavily doped base.

Such a manufacturing method exhibits certain drawbacks. First of all, the base is severely damaged during the stage of oxygen-ion implantation. This is because, with the wafer being disoriented by 7° with respect to the direction of the implantation beam, it is therefore seen by the latter in a quasi-amorphous state. The number of crystalline defects generated in the base is therefore a maximum. The zinc diffusion makes it possible partly to mask this degradation, but does not make it possible to regain the initial conductivity of the base. Moreover, during stages of implantation and of diffusion, the flanks of the collector mesa have to be protected by a nitride which induces a lithography stage and a supplementary process stage. With this method, the surface area of the intrinsic active area is defined, therefore limited, by the size of the collector. It should be noted that, because of the high diffusion of the zinc, there exists a substantial risk of seeing short-circuits appear at the base-emitter junction, having a devastating impact on the reliability of the components.

The THOMSON-CSF Central Research Laboratory started to produce GaInP/GaAs heterojunction bipolar transistors (D-HBT) in collector-up technology, as described in the article by HENKEL et al., IEEE Electronics Letters, Vol. 33, No. 7, March 1997. The emitter region situated below the extrinsic base is, here again, converted into a highly resistive layer, but by an ion implantation which is optimized with a view to keeping the base at its initial conductivity.

FIG. 2 shows the manufacturing method used. A metal collector contact is first of all deposited on the epitaxial structure. It is used as a mask for etching the collector layer (FIG. 2a). The structure is then implanted with boron ions through the base, and at a low dose (FIG. 2b). The angle of implantation is 0° so as to minimize the collisions between the boron ions and the crystalline lattice of the base. The metal base contacts are then deposited. The base and emitter layers are then etched in order to deposit metal emitter contacts (FIG. 2c) on an n$^+$ doped sub-emitter. These contacts then undergo annealing (416° C. for 10 mins, for example) allowing for the formation of an alloy at the metal/semiconductor interface. It is important to note that the resistivity of the base, which increases slightly during the ion-implantation stage, decreases and reverts, on completion of this annealing, to its initial value.

This manufacturing process, based on the different sensitivity of the conductivity of different semiconductor materials subjected to the same ion implantation, makes it possible, in a very effective way, to isolate the extrinsic emitter areas electrically while maintaining the conductivity of the base layer at a value close to its initial value. This latter property is, on the one hand, related to the fact that the implantation is done at lower dose. The number of crystalline defects generated in the base is therefore minimized. Moreover, the wafer is no longer disorientated with respect to the direction of the implantation beam (angle of implantation zero), the ions implanted are thus channeled into the crystalline network. The possibilities of a collision between an incident boron particle and the atoms and the electrons constituting the base material are then reduced. The same goes for the number of crystalline defects generated in the base. Moreover, the zinc-diffusion stage proposed by Yamahata et al. is then superfluous, bringing about simplification of the manufacturing method.

This particularly advantageous manufacturing method exhibits certain limitations, however. This is because, whereas the UHF performance of this type of component is particularly attractive ($F_{max}$=115 GHz), the value of the static current gain obtained is low. In order to analyze this behavior, we have to recall the results of the work by HORIO et al., published in IEEE Transactions on Electron Devices, Vol. 42, No. 11, November 1995.

The work by HORIO et al. bears on emitter-up HBT devices produced with GaAlAs/GaAs materials. This work highlighted an accumulation of electrons in the extrinsic base regions in the case in which the emitter-up HBT features an extrinsic collector made perfectly isolating and a surface area of the base-collector junction slightly less than that of the emitter-base junction. From this accumulation there results, on the one hand, a degradation in the cut-off frequency of the current gain ft and, on the other hand, a recombination of the carriers in the base which will heavily penalize the static gain of the transistor. In the case of a structure which is similar but featuring a semi-isolating extrinsic collector (which corresponds to an extrinsic collector electrically isolated by ion implantation), the phenomenon of electron accumulation seems much more limited, and therefore the degradations in the current gain and in $f_t$ become much smaller. Moreover, Horio observes that the performance of the component is optimal when the surface area of the emitter-base junction is slightly less than that of the base-collector junction, and is so whatever the nature of the extrinsic collector (isolating or semi-isolating).

Unfortunately, the collector-up topology amounts to being placed in the most unfavorable of the preceding two cases. This is because, in this structure, the surface area of the collector at the base-collector junction defines the active area of the component. The extrinsic collector areas are therefore non-existent and can be modeled by a perfect insulant. In this configuration, if the surface area of the base-collector junction is less than that of the emitter-base junction, the phenomenon of electron accumulation in the extrinsic-base regions is particularly significant. The same goes for the emitter-up topology; the optimal performance is obtained when the surface area of the emitter-base junction is the smaller of the two. The production of high-performance collector-up components therefore requires perfect control of the techniques of implantation and of etching which will culminate in the definition of the surface areas of the two junctions.

In the case of heterojunction bipolar transistors in collector-up topology, the etching of the collector mesa is based on the selectivity of etching between the two materials constituting collector and base (the case of the D-HBT) or base and etching-stop layer (the case of the S-HBT). The metal collector contact is used as a mask for etching the collector. The surface area of this contact therefore defines that of the base-collector junction plus or minus the sub-etching (if any).

FIG. 3 shows the etching profile which is obtained according to the crystalline orientation for a collector made of GaInP (the case of the D-HBT). This profile is conventionally obtained by chemical etching (for example by the use of hydrochloric acid, diluted or otherwise). It will be noted that, depending on the crystalline orientation, a re-entrant or outgoing angle is observed. The example is taken for the case of a GaAs substrate (100) oriented according to the European/Japanese standard for indexing wafers. The shape indicated is obtained very simply with the condition that the layer of GaInP is sufficiently fine (of the order of 0.5 μm). It will be noted that the etching of the GaInP is blocked at the GaAs/GaInP interface, which makes manufacturing easier (see French patent No 2 697 945). The layer of GaAs thus fixes the lateral dimension of the device. Once the structure has been implanted with boron, the surface area of the emitter-base junction is defined by the shape of the isolating wells created in the extrinsic emitter area. As could be seen above, the metal collector contact serves as an implantation mask, but the shape of these wells will also depend on the profile of the flanks of the collector mesa.

Thus, for a D-HBT in which the collector spigot is oriented along the crystallographic direction <0 1 1>, the flanks of the collector mesa are re-entrant (FIG. 4a). If x is defined as the difference between the width of the extrinsic collector (defined by the etching) and that of the extrinsic emitter (defined by the shape of the isolating wells), x is then negative and on the order of −0.2 μm. The emitter-base junction therefore exhibits a surface area greater than that of the base-collector junction, and x is sufficiently large enough to entail a substantial degradation in the current gain and in $f_t$.

If the collector electrode of the D-HBT is oriented along the crystallographic direction <0 1 −1>, the etching profile is then outgoing. The flanks of the collector mesa, which are not protected by the collector metalization, are then exposed to the ion implantation with boron. This gives rise to the appearance of isolating wells in the emitter 1, and also in the collector 2 (FIG. 4b). The width of the extrinsic collector is no longer defined by etching but by the shape of the collector-isolating wells. x is then negative, but small in absolute value. The degradation in the current gain and in f, is then less significant than in the preceding case, but is still present, however.

The etching of a collector made of GaAs (case of the S-HBT) is carried out in two operations: a reactive-ion etching (such as $SiCl_4$) followed by a chemical etching (with citric acid, for example). This is because, in order not to damage the base material, advantage can be taken of the existence of the very wide selectivity of etching between a phosphorus-based layer and an arsenic-based layer. An etching-stop layer of shallow thickness is therefore added between the collector (n GaAs) and the base ($p^+$ GaAs). Made for example from GaInP, it makes it possible to stop the etching of the collector made of GaAs. A chemical etching of the stop layer is then carried out using a solution which may be based, for example, on dilute hydrochloric acid. On completion of this sequence, the profile obtained does not depend on the crystalline orientation and exhibits an outgoing angle associated with a sub-etching at the interface with the ohmic contact (FIG. 4c). The width of the extrinsic collector is therefore defined by the etching flanks and x is, here again, negative but small in absolute value. The degradation in the current gain and in $f_t$ is substantially the same as in the preceding case.

SUMMARY OF THE INVENTION

Thus, solutions have been applied in order to get around the parasitic injection of electrons into the extrinsic base which constitutes the most significant difficulty in the production of collector-up HBTs. Among these, the production of isolating wells in the extrinsic emitter by ion implantation at low dose through the base makes it possible, furthermore, to keep the latter at its initial conductivity. However, as we have been able to see, it is not possible, in the case of the manufacture of collector-up HBTs consisting of $Ga_xIn_{1-x}As/Ga_yIn_{1-y}P$ compounds, to define the surface areas of the emitter-base and base-collector junctions in such a way as to obtain the optimal performance capable of being reached with such structures. The present invention aims to reach these performance levels by optimizing the collection of the minority carriers at the exit from the base, that is to say by getting round the accumulation of electrons in the extrinsic-base regions. To do that, it is necessary to be able to define a base-collector junction the surface area of which is larger than that of the emitter-base junction, and for the extrinsic collector, if it exists, to be made from a semi-isolating material.

The invention therefore relates to a collector-up heterojunction bipolar transistor that includes, stacked on a substrate:

an emitter layer a base layer a collector layer characterized in that:
  the surface area of the base-emitter active junction is of smaller dimensions than the surface area of the base-collector active junction;
  the material of the base layer exhibits a sensitivity of the electrical conductivity to ion implantation which is lower than the sensitivity of the electrical conductivity of the material of the emitter layer to the same ion implantation.

The invention also relates to a method of manufacturing a collector-up heterojunction bipolar transistor including the epitaxial growth of semiconducting layers on a semiconductor substrate:
  an emitter layer
  a base layer
  a collector layer
  characterized in that:
    the materials of the base layer and of the emitter layer are chosen such that the material of the base layer exhibits a sensitivity of the electrical conductivity to ion implantation which is lower than the sensitivity of the electrical conductivity of the emitter layer to the same ion implantation.
    and in that it includes the following additional stages:
      production of a mask on the collector layer, having a width ($l_c$) defining the width of the collector to be obtained, then carrying out a first ion implantation making it possible to render the material of the emitter layer isolating on either side of the emitter to be obtained, then carrying out a second ion implantation using one or more energies which are lower than the first ion implantation, so as to render the material of the collector layer isolating on either side of the collector to be obtained.

BRIEF DESCRIPTION OF THE DRAWINGS

The various objects and characteristics of the invention will emerge more clearly in the description which will follow, given by way of example, as well as from the annexed figures. These figures represent:

FIGS. 9a to 9l, an example of an embodiment method, according to the invention, of a collector-up HBT transistor.

DESCRIPTION OF THE PREFERRED EMBODIMENTS

In general, the principle of the present invention is based, on the one hand, on the selectivity of etching between the two materials constituting collector and base (the case of the D-HBT) or etching-stop layer and base (the case of the S-HBT), and, on the other hand, on the differing sensitivity of the conductivity of the semiconductor materials subjected to an ion implantation.

By way of example, the invention is described in the context of NPN $Ga_{0.5}In_{0.5}P/GaAs$ double-heterojunction bipolar transistors in collector-up topology. However, it applies by simple transposition to any heterojunction bipolar transistor structure in collector-up topology using $Ga_xIn_{1-x}As/Ga_yIn_{1-y}P$ heterostructures whether the material constituting the collector is different from that of the base (case of the D-HBT) or identical (give or take the doping characteristics, in the case of the S-HBT). It is also applicable to a number of components in the course of development (SiC/GaN, AlGaN/GaN, AlGaN/InGaN, etc.).

Figure 1A:
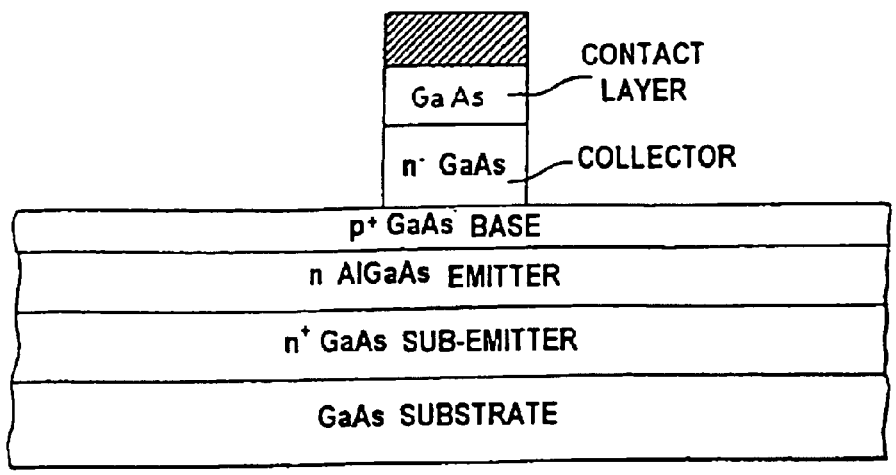
FIGS. 1a to 4c, various states of the technique described in the foregoing.
Figure 1B:
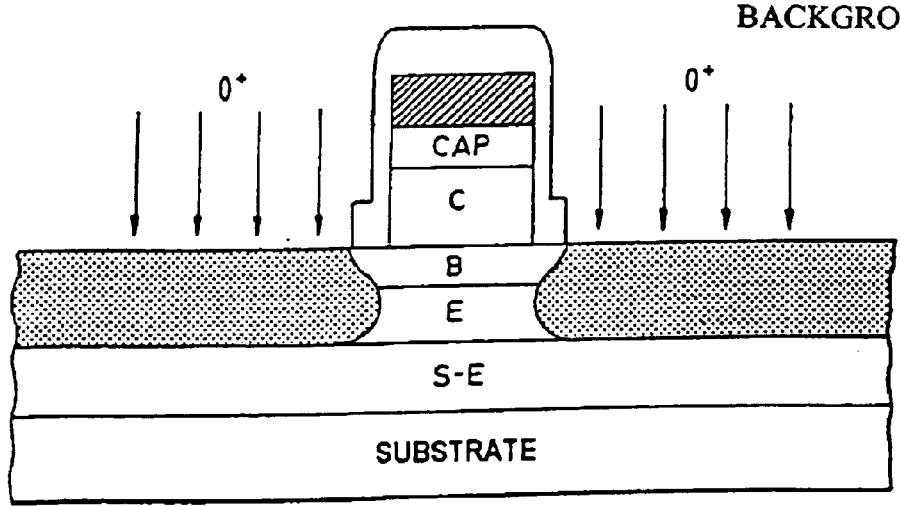
Figure 1C:
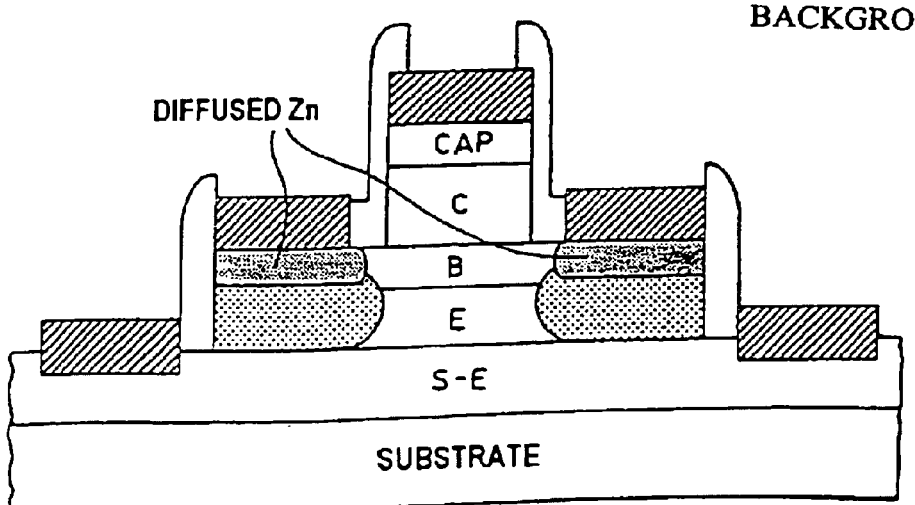
Figure 2A:
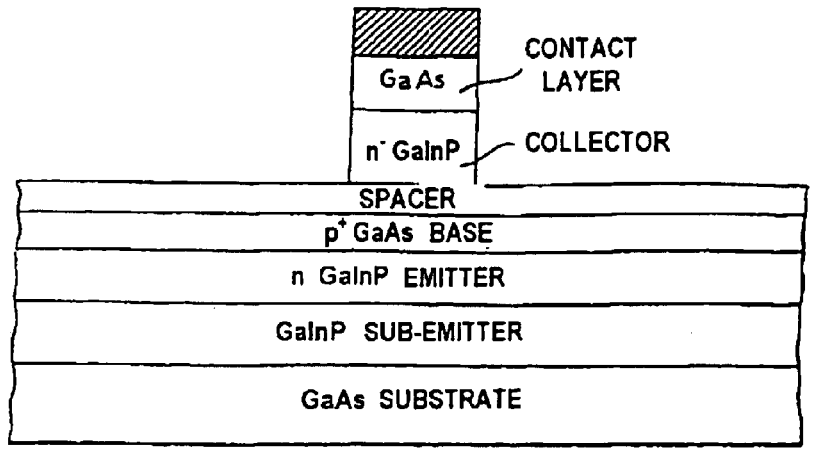
Figure 2B:
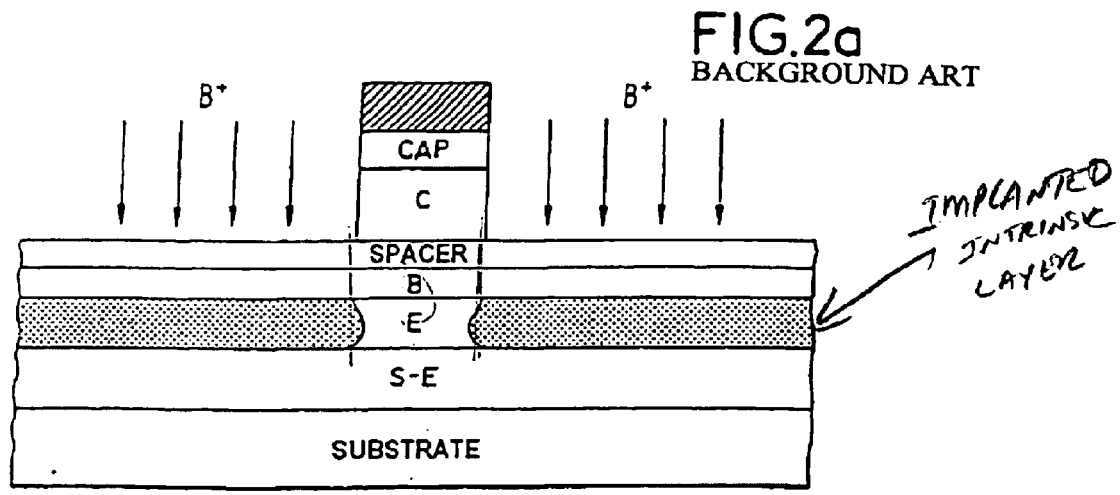
Figure 2C:
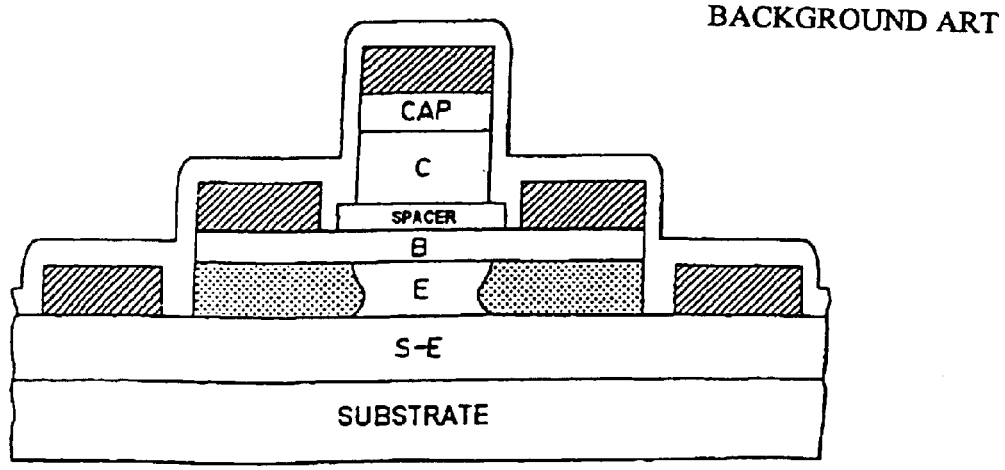
Figure 3:
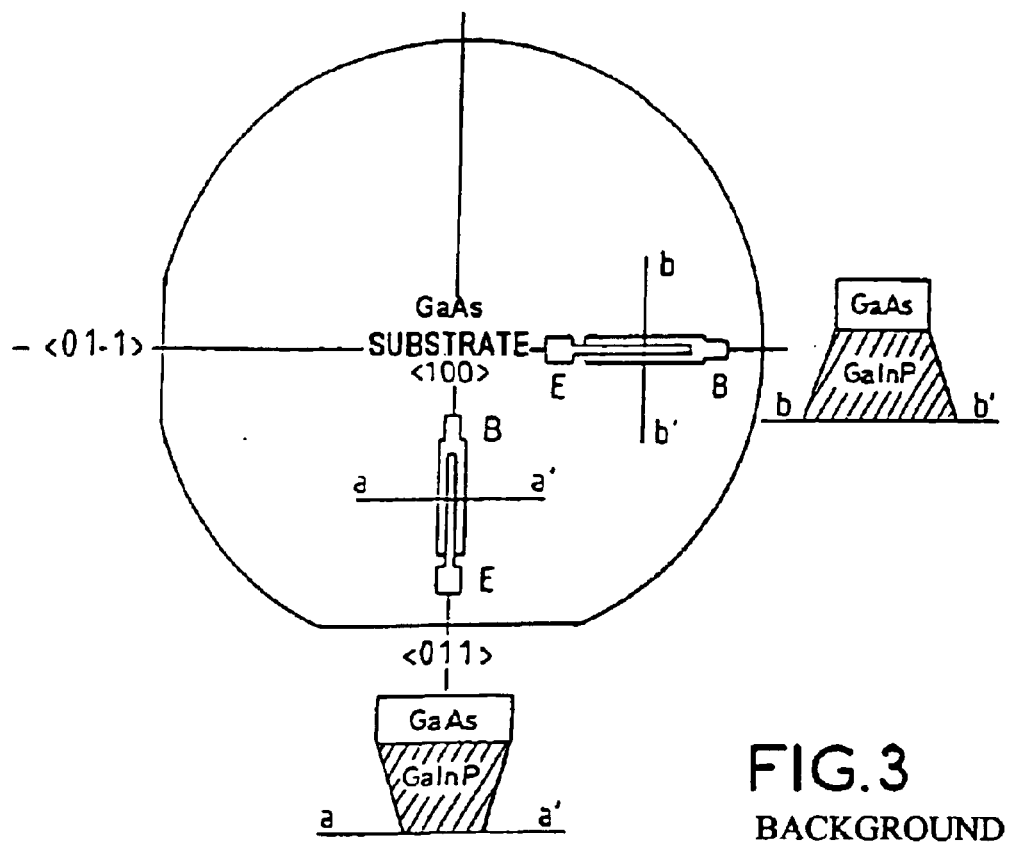

As we have described above in FIG. 3, the etching profile of the GaInP depends heavily on the crystalline orientation. Depending on the crystallographic direction along which the collector electrode is oriented, the flanks of the collector mesa exhibit a re-entrant or outgoing angle. It is reiterated that the lateral dimension of the device is then fixed by that of the contact layer in the $n^+$ GaAs, the etching of the GaInP being blocked at the interface of the two materials.

Figure 5A:
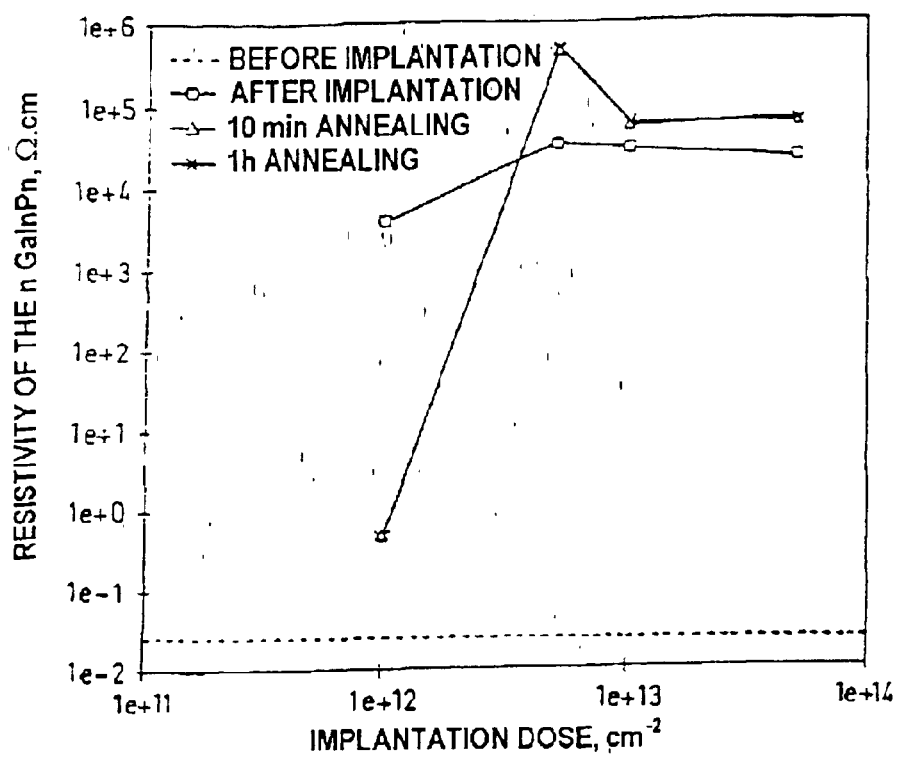
FIGS. 5a and 5b, curves showing the effects of an ion implantation on the layers of an HBT transistor according to the invention.
Figure 5B:
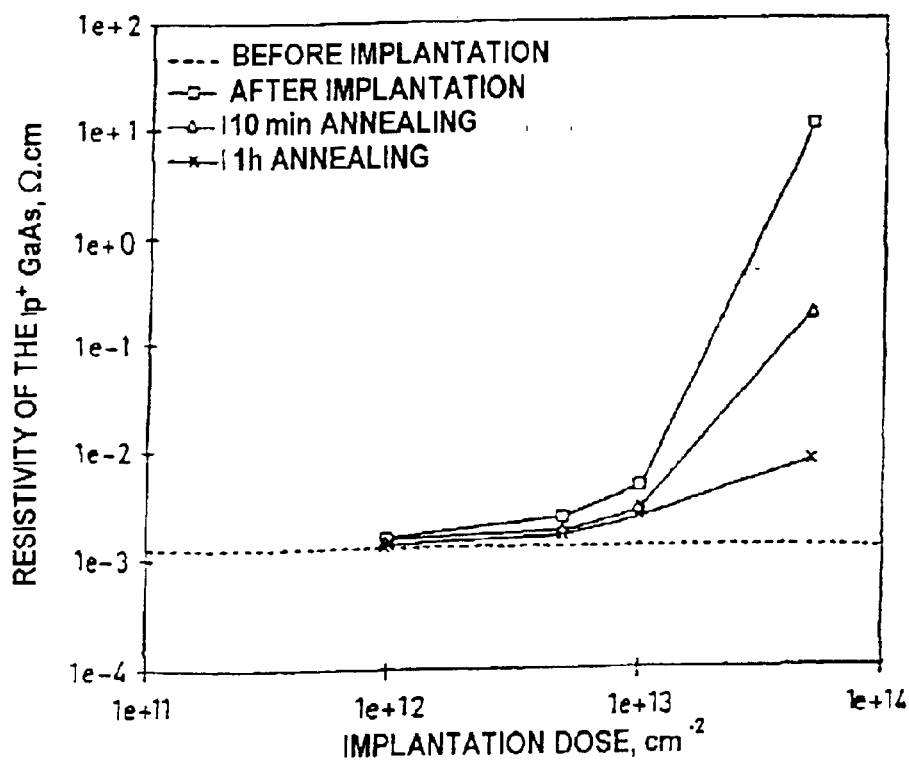

FIGS. 5a and 5b show, by way of example, the difference in sensitivity of the electrical conductivity of the n-doped GaInP and of the $p^+$ doped GaAs respectively, to a boron implantation at 200 keV at zero angle of implantation, as a function of the dose of ions input into the structure. This progressive change is continued as a function of the annealing time at 416° C. In the case of the n-type GaInP, the material exhibits an electrical resistivity greater than $10^5$ $\Omega.cm$ for an implantation dosage of $5\times10^{12}$ $cm^{-2}$, whereas the $p^+$ type GaAs remains practically insensitive to the ion implantation up to dosages of $10^{13}$ $cm^{-2}$. The very different behavior of these two materials will allow us to make the n-doped GaInP layers practically isolating, while preserving a $p^+$ type GaAs layer (the base of an HBT in this instance) at its initial electrical resistivity. It is important to note that a similar behavior exists with other atomic types, or even between two layers of the same material featuring different doping characteristics (n and p type GaAs, for example).

Figure 6:
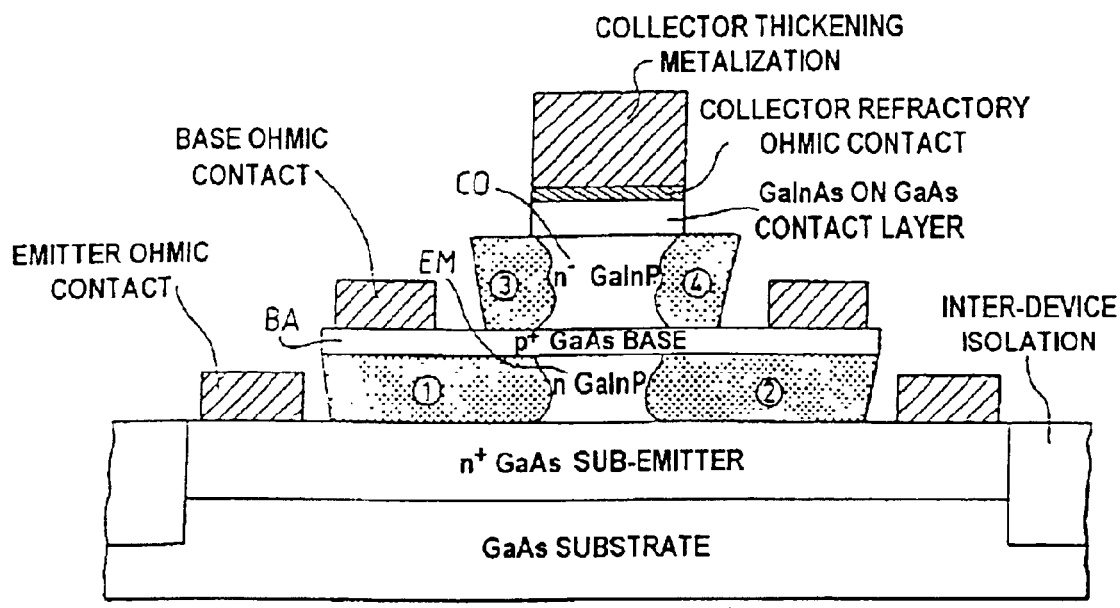
FIGS. 6 and 7, an example embodiment of an HBT transistor according to the invention.

By virtue of these physical/chemical properties, it is possible to produce components exhibiting, on either side of the base, a semiconductor layer which is rendered locally electrically isolating by ion implantation. FIG. 6 shows the sectional view of a collector-up D-HBT designed in the light of the present invention. The surfaces of the emitter-base and the base-collector junctions are then defined during the ion-implantation stage. It will be noted that there is formed, on either side of the collector mesa, before deposition of the base contact, an isolating well equivalent to a side wall, which makes it possible to reduce the presence of metalization on the bared flanks of the collector mesa.

Hence it is seen that the device of the invention relates to a collector-up HBT transistor which particularly includes an emitter layer EM, base layer BA and collector layer CO stack, in which the collector and the emitter are self-aligned by implantation and in which:
  the emitter layer EM includes the intrinsic emitter itself framed by isolating material, likewise the collector layer CO includes the collector framed by isolating material;
  the surface area of the base emitter junction is less than the surface area of the base collector junction;
  the material of the base BA is such that it exhibits a sensitivity of the electrical conductivity to an isolating ion implantation which is less than the sensitivity of the electrical conductivity of the material of the emitter EM to the same implantation.

The method according to the invention of producing such a device will now be described.

The collector spigot (electrode) is oriented along the crystallographic direction <0 1 1> in such a way that, during the etching stage, the flanks of the collector layer made electrically isolating exhibit re-entrant angles. A GaInAs contact layer at the peak of the epitaxial structure makes it possible to form the ohmic contact lead by the use of a refractory metal such as TiWSi, WN, or TiW, etc. In order to obtain low collector resistance and to produce an effective ion-implantation mask, metalization by Ti/Pt/Au, typically 2 µm wide and with a thickness of the order of 1 µm, is deposited on the surface. The semiconductor materials protected by this metal mask have their initial electrical conductivity preserved. The thickness of the metalization of refractory metal is sufficiently fine to allow the ions to pass through it without major loss of energy. The implantation stage is divided into two operations using the same metal mask. One of the two operations consists in carrying out an implantation at high energy, low dosage ($2.5 \times 10^{12}$ cm$^{-2}$), through the whole of the structure, and which can be at zero implantation angle. The energy supplied to the implanted ions is calculated in such a way as to render the GaInP emitter layer isolating in the areas situated under the future extrinsic base (isolating wells 1 and 2) so as to eliminate any parasitic injection of electrons. The other operation consists in defining the surface area of the base-collector junction via an implantation at lower energy, low dose and through the whole of the structure. The isolating wells 3 and 4 are thus created locally in the GaInP collector layer. During these stages, the distribution tail of the ions then passes through the base without really degrading it because of the low sensitivity of the p$^+$ GaAs material to the implantation. The slight increase in the resistivity of the base material is compensated for during a post-implantation annealing stage (which can be that for annealing the alloyed ohmic contact, for example) making it possible to bring the concentration of crystalline defects down to the lowest possible level. It should be noted that the use of a refractory material offers the possibility of annealing the structure at high temperatures (if necessary) after definition of the collector mesa.

Figure 4A:
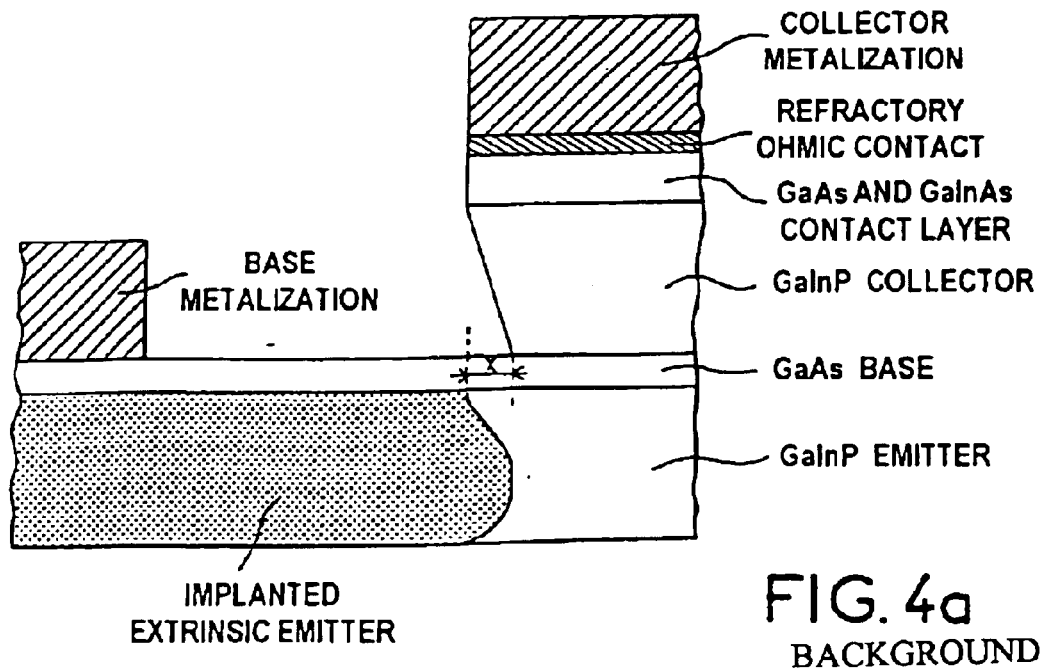
Figure 4B:
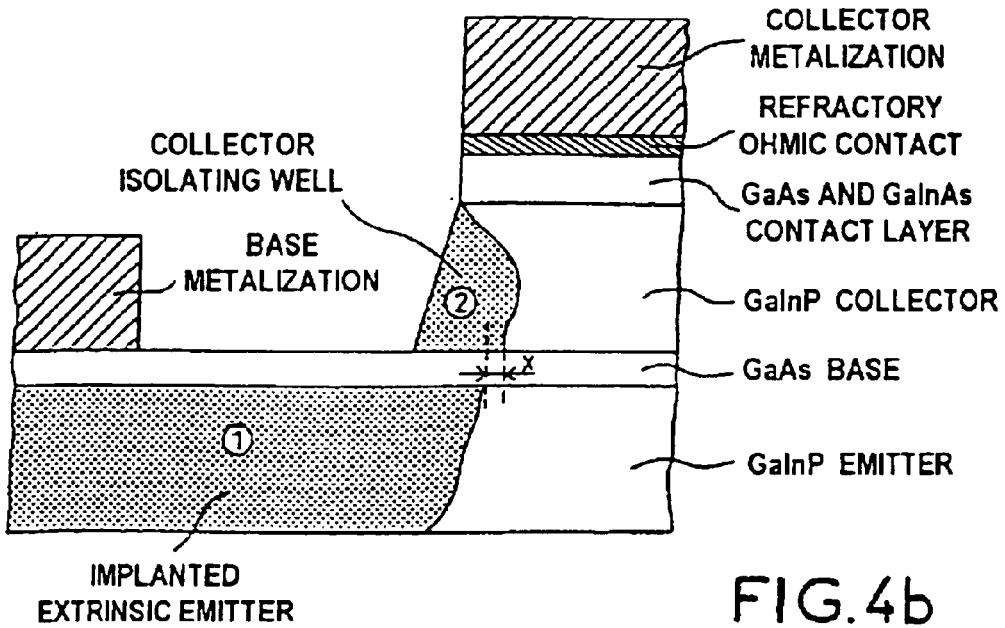
Figure 4C:
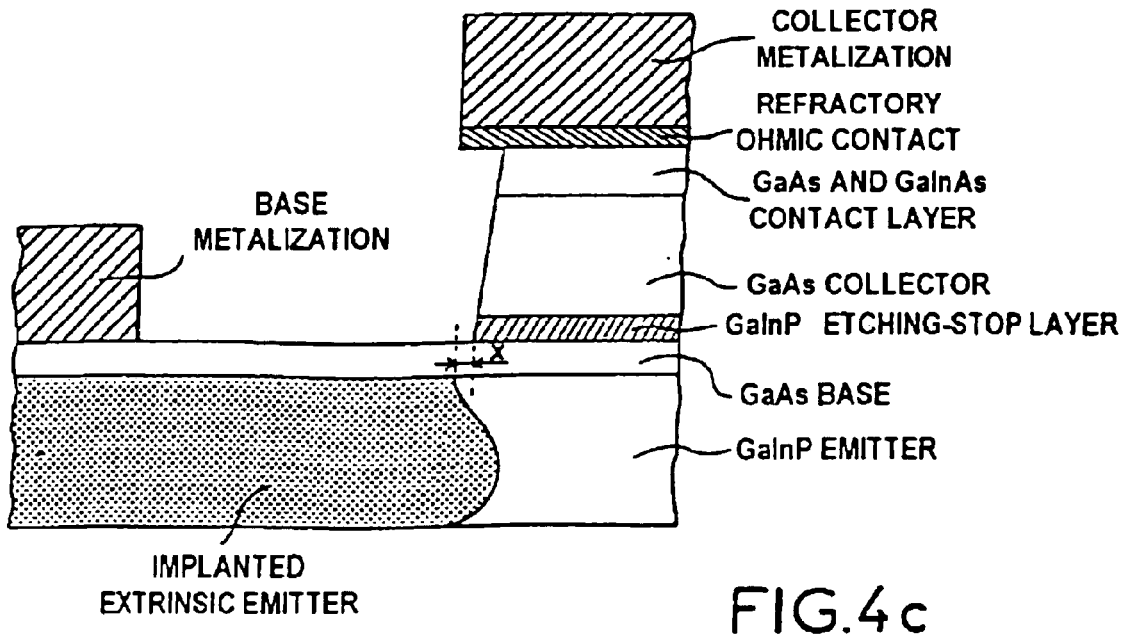
Figure 7:
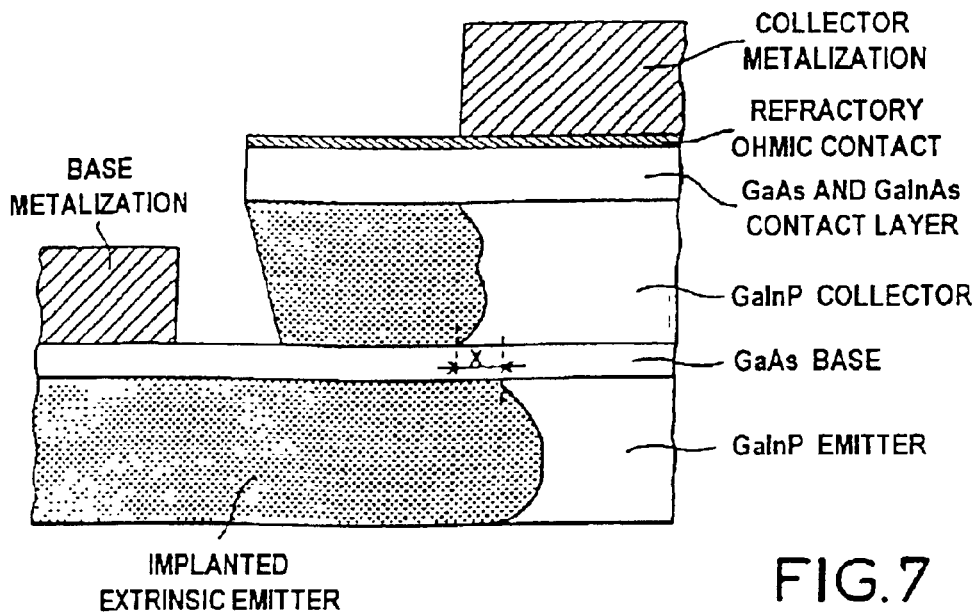

It will be noted that the higher the energy supplied to the implanted ions, the greater is their depth of penetration, and also the more spread out is the final distribution of the ions in the bulk (and, thereby, of the crystalline defects which they engender). Hence the surface area of the emitter-base junction (defined by the implantation at high energy) will be smaller than that of the base-collector junction (defined by an implantation at lower energy). FIG. 7 represents the profile which will typically be obtained on conclusion of the implantation stage; x, defined as in FIG. 4, is of the order of +0.2 µm. The present invention therefore allows us to eliminate the accumulation of the electrons in the extrinsic base region and thus to come close to the optimal performance levels allowed by the structure of the component.

The collector mesa should typically be of the order of 1 µm on each side of the Ti/Pt/Au collector strip so as to achieve effective collection of the electrons at the exit from the base. The width of 1 µm makes it possible to find an effective compromise so as to produce components functioning at UHF. The UHF gain tends, in effect, to drop when the edge of the base ohmic contact strip is moved away from the active emitter area, since there is then an increase in the base resistance and the base-collector capacitance. It is possible to minimize the influence of the latter by etching the refractory-metal layer, and by etching, or isolating by implantation at high dosage, the n+ GaAs and GaInAs contact layer, above the collector-isolating wells. And by taking certain specific precautions, the ohmic base contact can be produced in self-alignment with respect to the collector mesa.

Figure 8:
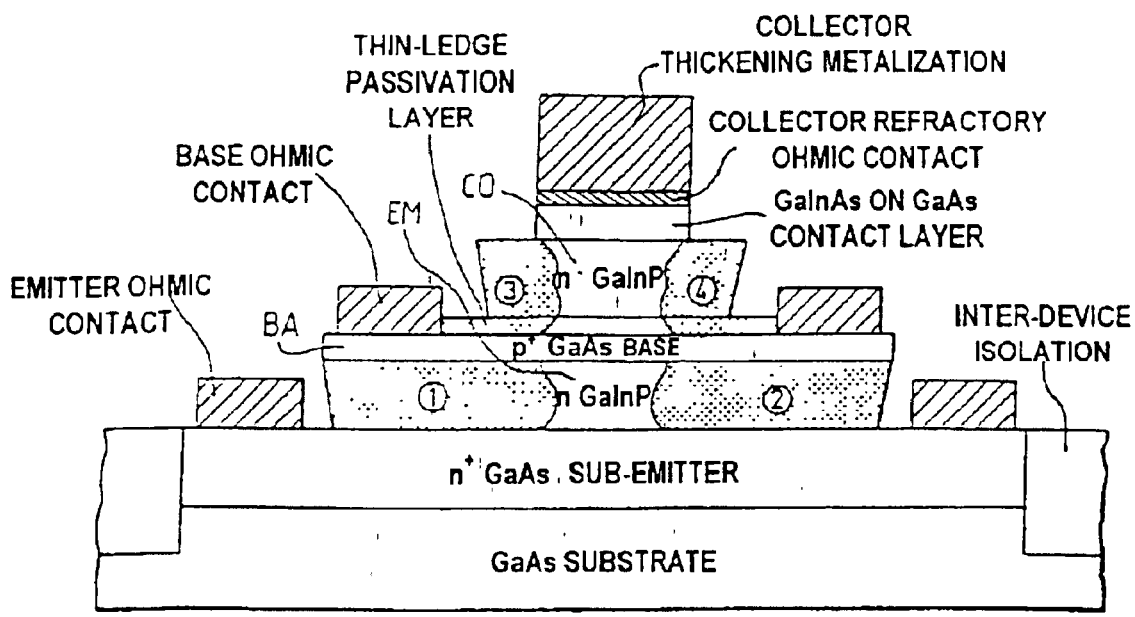
FIG. 8, a variant embodiment of an HBT transistor according to the invention.

Moreover, such dimensions of the collector mesa remain compatible with the thick-ledge passivation method described in the French patent No (2 764 118). This is because at least two mechanisms are acting on the drift of the HBTs in the course of operation. It is a question, on the one hand, of the progressive change in the recombinations in the neutral base and, on the other hand, of an increase in the surface recombinations in the free surface of the base. The presence of a material with a wide forbidden band on either side of the active collector passivating the extrinsic base is an effective solution for combating this second mechanism. The collector GaInP layer, rendered isolating, therefore limits the surface recombinations at the foot of the collector spigot. It thus passivates both the free surface of the extrinsic base and the flanks of the collector. The present invention can also be associated with a more conventional fine ledge-type passivation layer as described in the French patent No 2 736 468. An example of a component produced with this invention associated with a conventional thin ledge is given in FIG. 8. The manufacturing method used for the present invention is then directly adaptable. The epitaxial structure remains identical, only the sequential linking of the manufacturing stages is altered.

Moreover, this invention can use a heat sink making it possible to remove some of the heat energy through the top of the structure. It may be of the "nitride" type like the one previously patented (French patent No. 2 737 342) or arise from any other similar method.

It may be recalled that, in the case of an S-HBT (collector made of n$^-$ GaAs), the refractory ohmic contact can be replaced by a Schottky-type contact. A metal contact (Ti/Pt/Au, for example) is then deposited directly on the n$^-$ GaAs collector. The contact layer (n$^+$ GaInAs on n$^-$ GaAs) is then superfluous. The epitaxial structure is thus simplified. Moreover, placed as close as possible to the n$^-$ base-collector field area (where the major part of the heat is generated), the metal contact, via its high thermal conductivity, promises to offer better thermal behavior.

FIGS. 9a to 9l describe, in more detail, the manufacturing method according to the invention making it possible to obtain a double-heterojunction bipolar transistor in collector-up topology. The structure presented here is produced without a thin-ledge-type passivation layer but with an upper heat sink. The description represents only the succession of processes necessary to produce the basic component without taking account of active or passive components produced in addition during the fabrication of the overall function in which it has to culminate.

FIG. 9a

On the basis of a semi-isolating GaAs substrate, the epitaxial growth of the following layers is carried out:

a sub-emitter layer made of n-doped GaAs;

an emitter layer made of n-doped GaInP;

a base layer made of p$^+$ doped GaAs;

a collector layer made of n$^-$ doped GaInP;

a contact layer made of n$^+$ doped GaInAs on n$^+$ doped GaAs.

Advantageously, a spacer made from a layer of n-doped GaAs associated or not associated with a layer of n-doped GaInP, or a gradual layer of n-doped $Ga_xIn_{1-x}As_yP_{1-y}$, may be inserted between base and collector (or even between emitter and base) in order to minimize the phenomenon of electron accumulation in the potential well of each of the heterojunctions. This spacer is not represented here.

A refractory-metal layer is deposited ex-situ so as to provide the collector refractory ohmic contact.

FIG. 9b

After production of a protective mask made of resin, a stage of electrical-isolation deep ion (H, He, B, O, F, etc) implantation is carried out, so as to reduce the parasitic effects in the component and to achieve inter-component isolation.

FIG. 9c

Deposition of a metalization for thickening of the collector ohmic contact of width $l_c$ is then carried out by lift-off (Ti/Au, Ti/Pt/Au, etc), and then selective ion implantation is carried out with boron at high energy, in such a way as to define the isolating wells 1 and 2 in the extrinsic emitter areas. This implantation stage leads inherently to the defining of the shape of the intrinsic emitter and thus to that of the surface of the emitter-base junction.

Still with the protective mask made from the thickening metalization of the ohmic contact, the structure is implanted with boron, but at lower energy so as to define the isolating wells 3 and 4 in the extrinsic collector areas. This implantation stage leads inherently to the definition of the shape of the intrinsic collector and thus to that of the surface of the base-collector junction.

By virtue of the fact that the boron implantation into the emitter takes place at high energy and that the implantation into the collector takes place at lower energy, the surface implanted within the emitter-base junction is larger than that of the collector-base junction. Hence the surface area of the base/collector junction is greater than the surface area of the base/emitter junction.

FIG. 9d

The metalization for thickening of the collector contact is again used as a protective mask. A dry etching of the refractory metal is then carried out by reactive-ion etching based on $SF_6$, for example.

FIG. 9e

Then the collector mesa is defined. To do that, a protective mask of resin with a width $L_C > l_C$, is produced. Etching of the GaInAs contact layer is carried out by wet etching based on citric acid, then etching of the GaAs contact layer is carried out by chlorinated reactive-ion etching (RIE) such as $SiCl_4$, or by chemical etching using citric acid, for example, and of the collector layer made of GaInP implanted with boron in chemical etching mode based on hydrochloric acid.

FIG. 9f

The base ohmic contacts are deposited by lift-off technique. The metal film used can be made from an alloy of Ti/Pt/Au or Mo/Au, for example.

FIG. 9g

A protective mask is produced from resin, having a width $L_B > Lc$, then the etching of the base mesa is carried out by the dry method (chlorinated reactive-ion etching) or combined (RIE then chemical) etching, followed by the etching of the GaInP emitter layer implanted with boron in chemical etching mode based on hydrochloric acid. The etching of the GaInP is blocked at the GaAs/GaInP interface. The lateral dimension of the base mesa thus fixes that of the emitter mesa.

FIG. 9h

The emitter ohmic contacts are deposited using the lift-off technique.

FIG. 9i

Then a resin protecting the whole of the surface area of the component is deposited. This resin is opened at the surface of the GaInAs/GaAs contact layer.

The areas of this contact layer thus bared and not protected by the collector-thickening metalization are then etched in such a way as to minimize the base-collector capacitance. Then etching of the GaInAs contact layer is carried out by wet etching based on citric acid, then etching of the GaAs contact layer is carried out by chlorinated reactive ion etching (RIE) such as $SiCl_4$, or by chemical etching by the use of citric acid, for example.

A passivation dielectric layer protecting the whole of the surface of the component (FIG. 9j) is carried out.

Figure 9A:
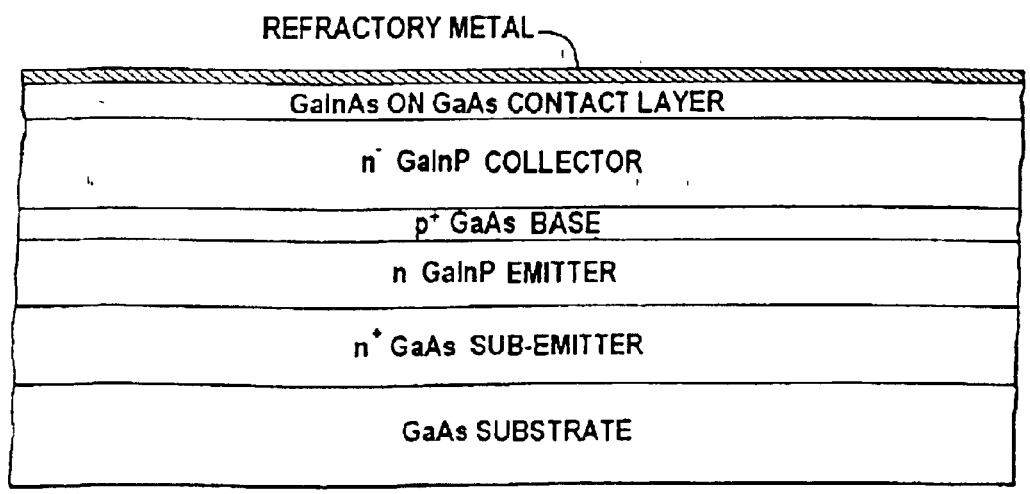
Figure 9B:
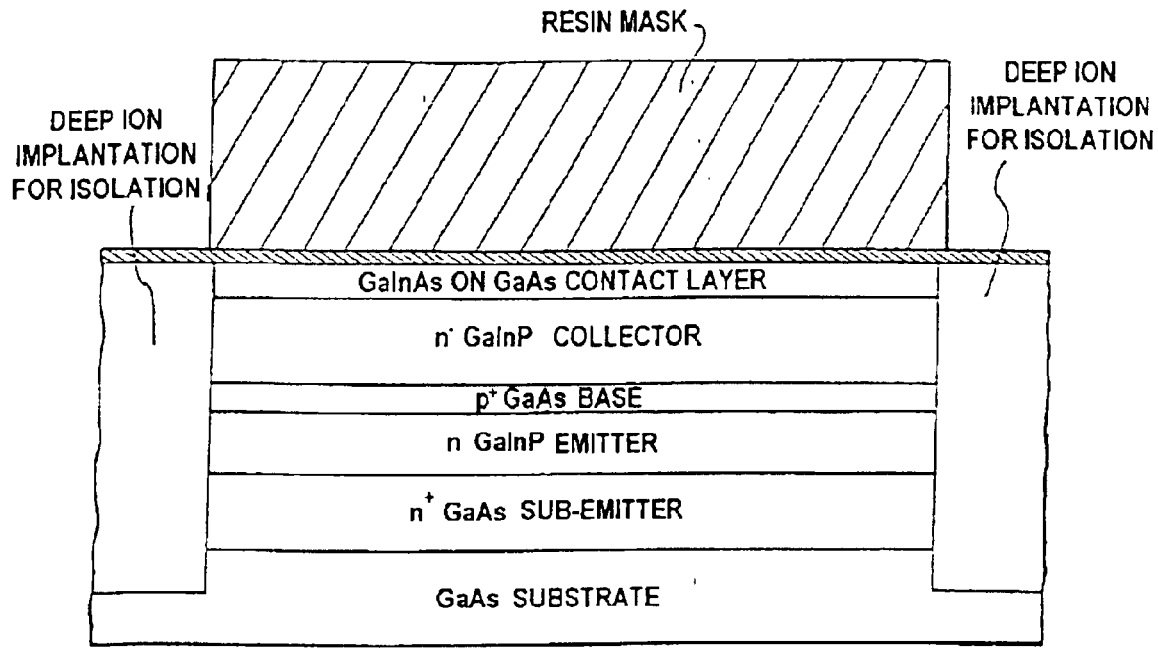
Figure 9C:
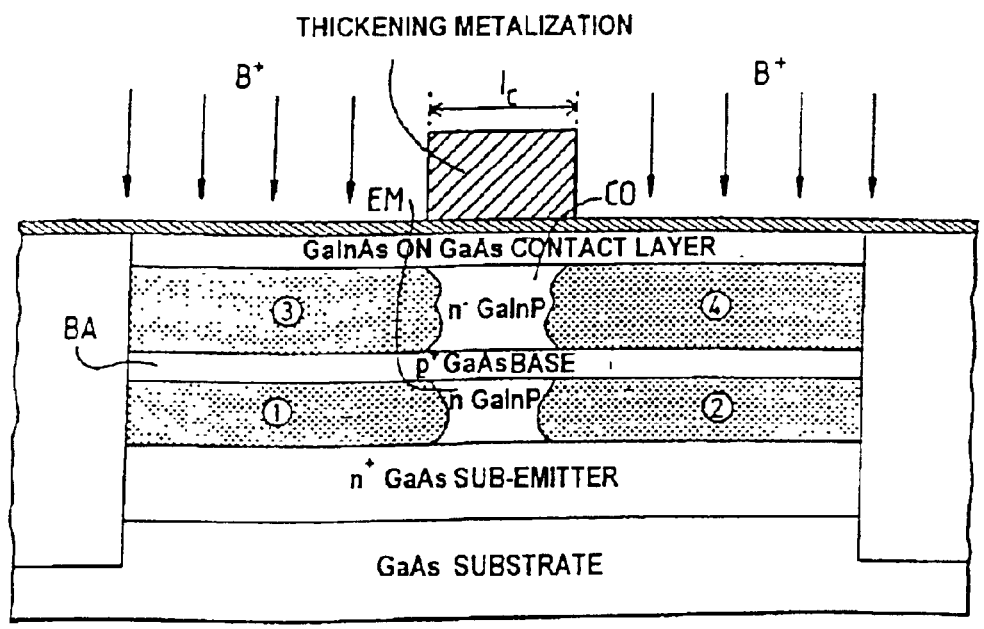
Figure 9D:
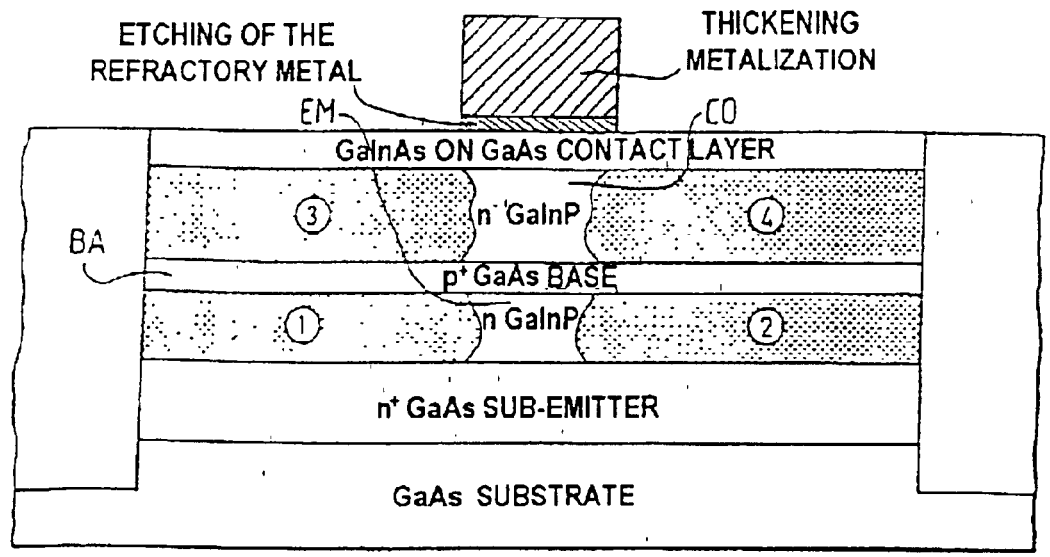
Figure 9E:
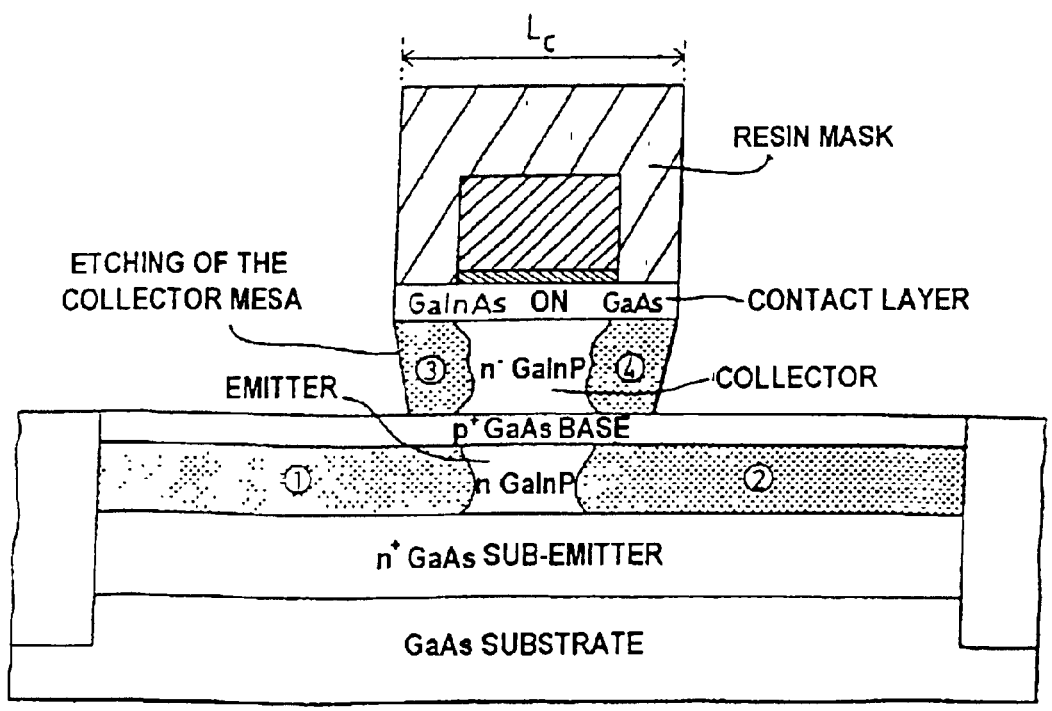
Figure 9F:
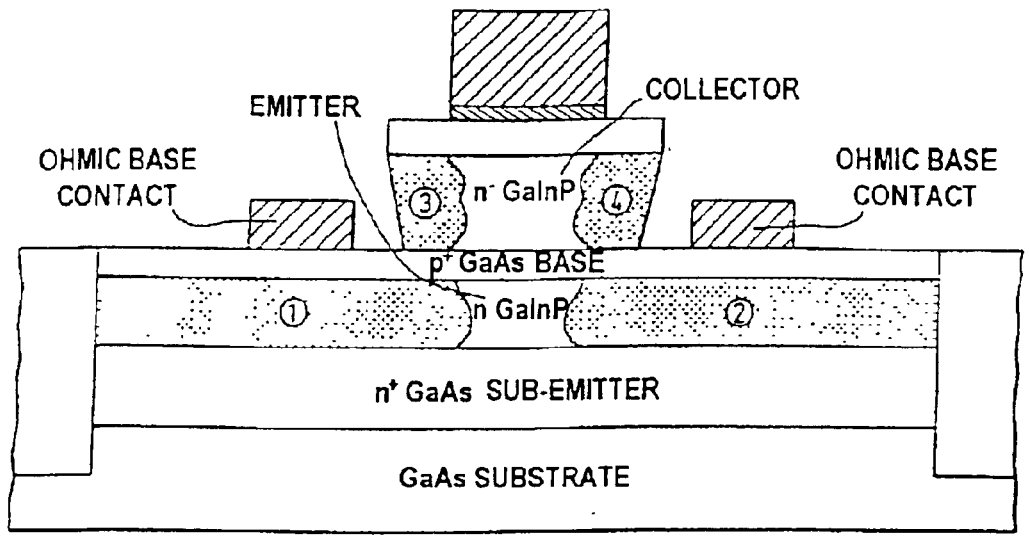
Figure 9G:
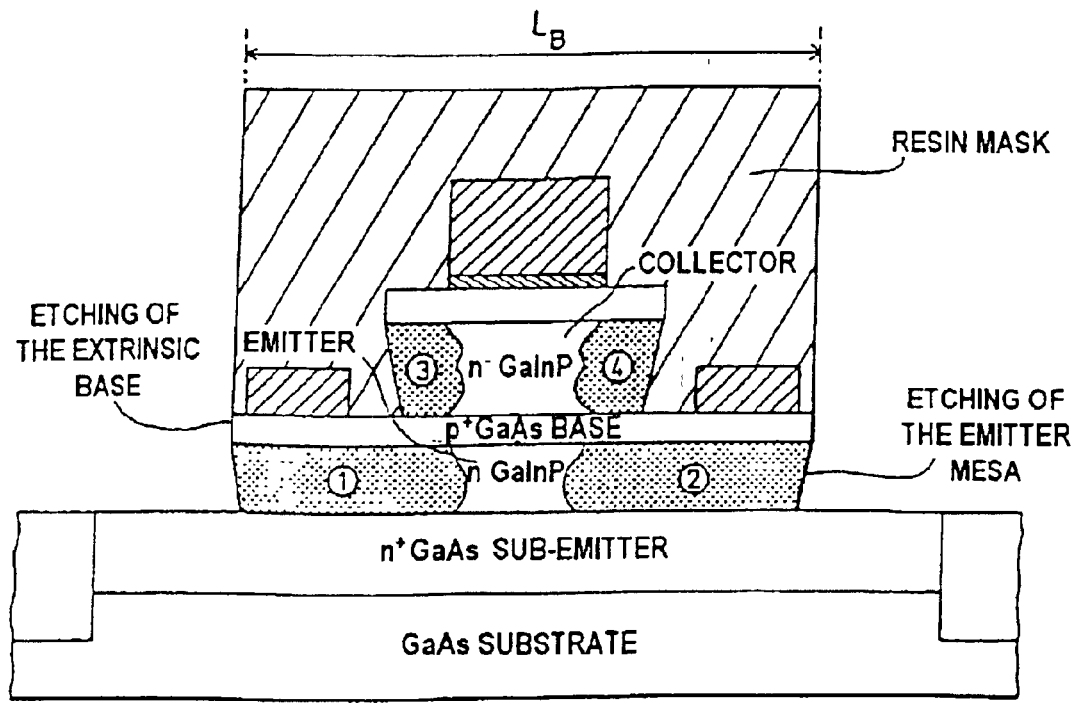
Figure 9H:
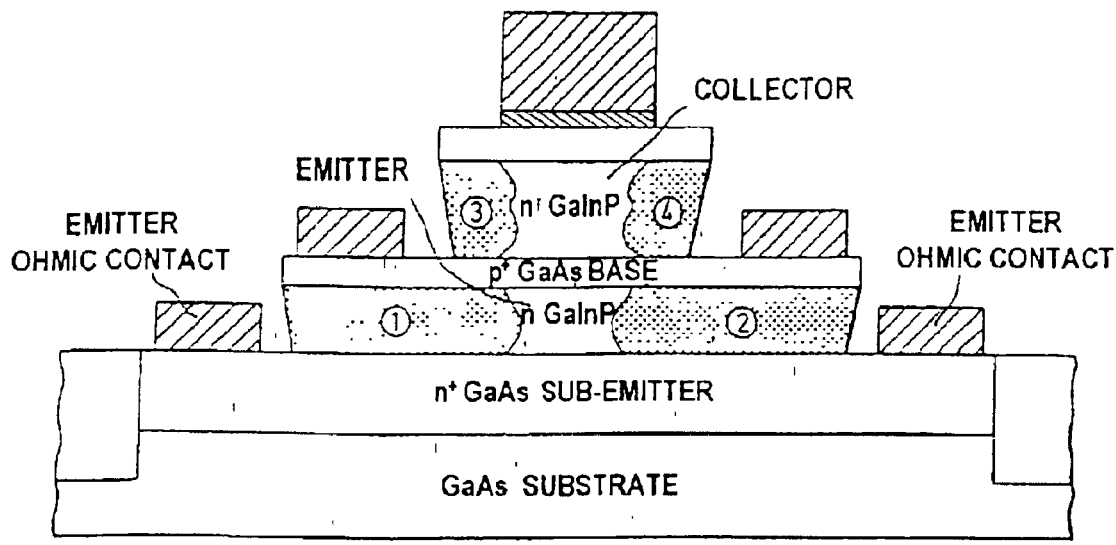
Figure 9I:
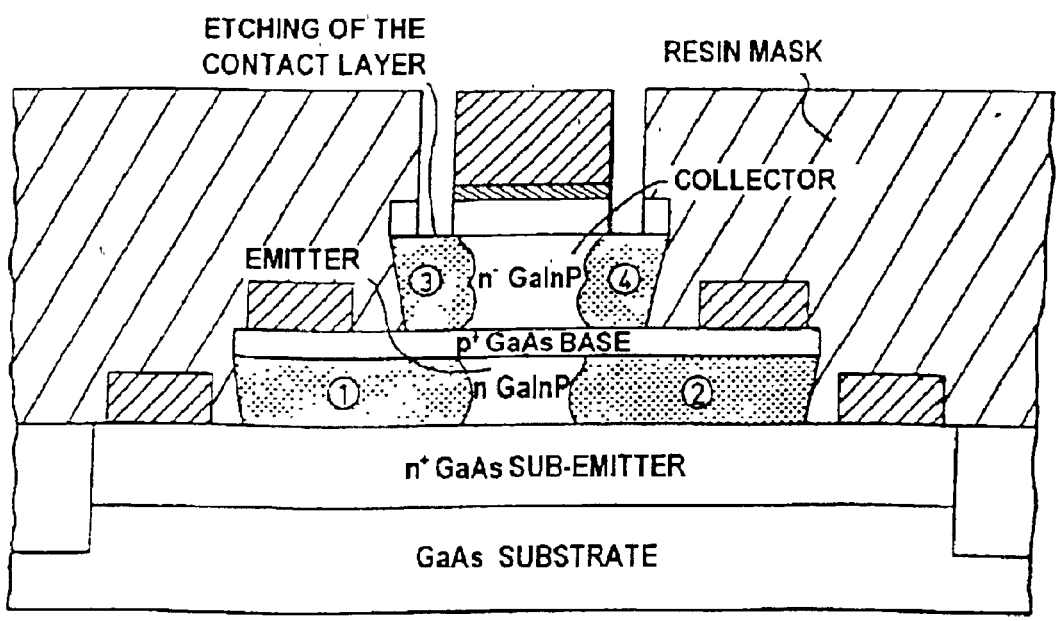
Figure 9J:
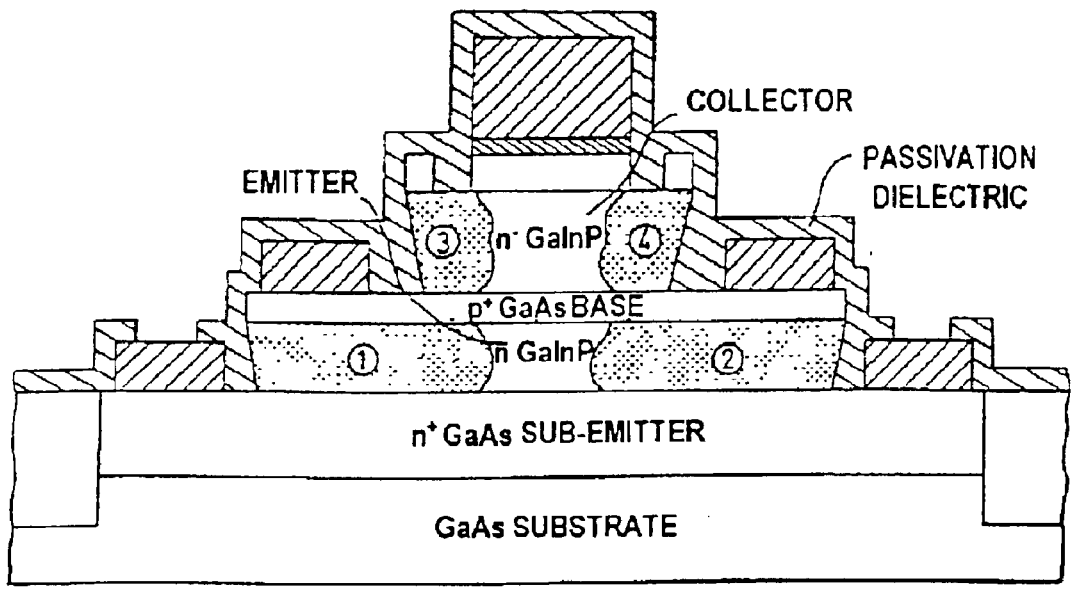
Figure 9K:
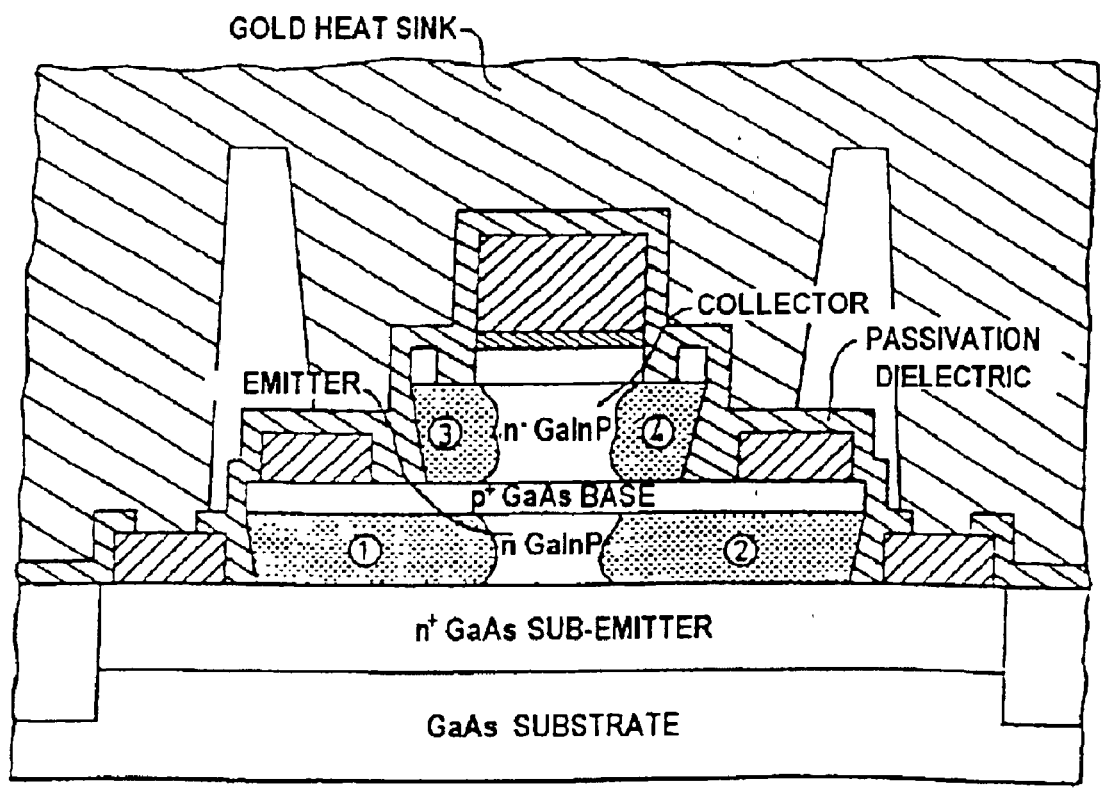
Figure 91:
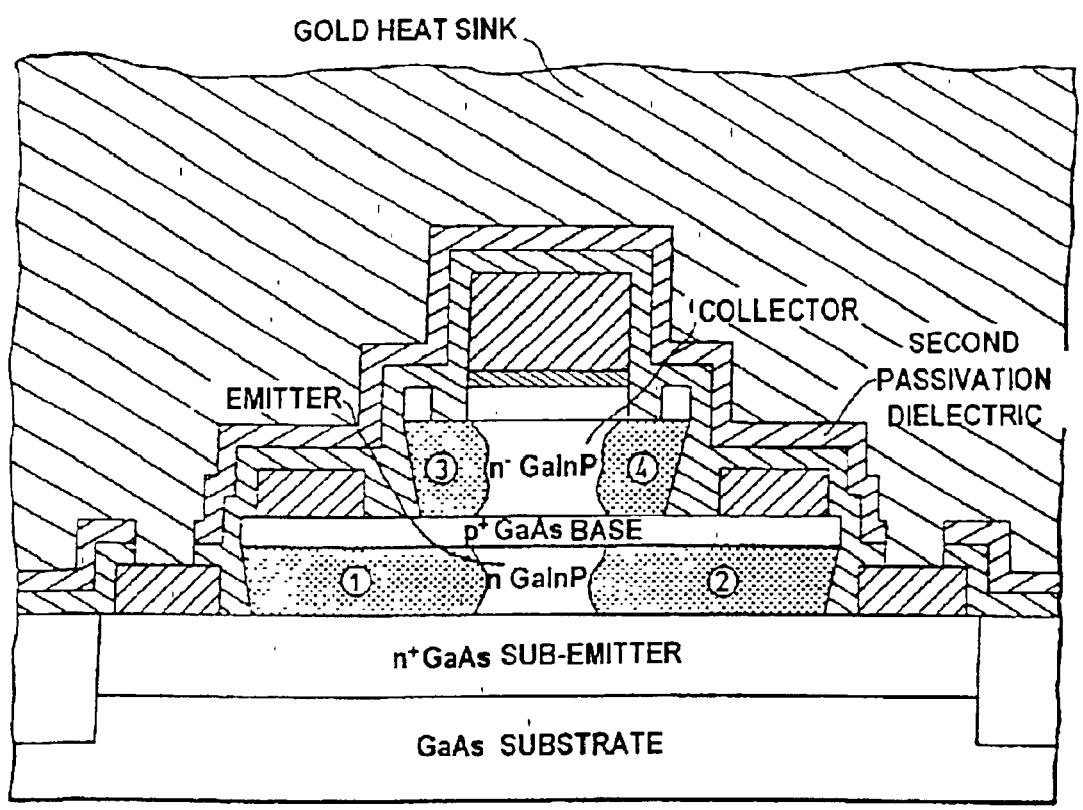

FIGS. 9k and 9l

It is then possible to form a heat sink resting on the top of the structure after passivation of the component, as is described in the French patent No 2 737 342.

Such a heat sink can be based on a pillars/beams technique as represented in FIG. 9j. Advantageously, the air present under the beam can be replaced by a dielectric possessing good planarisation properties such as benzocyclobutene (BCB) for example, which makes it possible, from the point of view of its mechanical properties, to reinforce the structure particularly with a view to offset operations.

Other solutions can be envisaged for producing the heat sink. FIG. 9k presents the sectional view of an HBT using a heat sink of the "double nitride" type. With this technique, the heat sink covers the whole of the component and does not use bridges (in air, in BCB, etc). The stage of producing the pillars is dispensed with, the removal of the heat energy, and thus the thermal behavior of the component, are optimal. However, a slight degradation in the value of certain parasitic elements should be anticipated (increase in the parasitic collector capacitance, for example), a degradation possibly slightly influencing the UHF behavior of the component.

What is claimed is:

1. A collector-up heterojunction bipolar transistor comprising, stacked on a substrate:
    an emitter layer;
    a base layer; and
    a collector layer, wherein
    a surface area of a base-emitter junction is of a smaller size than a surface area of a base-collector junction,
    a material of the base layer exhibits a sensitivity of electrical conductivity to ion implantation which is lower than a sensitivity of electrical conductivity of the material of the emitter layer relative to a same ion implantation, and
    the emitter layer and the collector layer each include an intrinsic area framed by an isolating material.

2. The heterojunction bipolar transistor as claimed in claim 1, wherein a width of each collector electrical isolating element is approximately one micron, and a width of a mesa is approximately two microns.

3. The heterojunction bipolar transistor as claimed in claim 1, wherein the collector layer comprises n-doped $Ga_xIn_{1-x}P$, the base layer comprises p-doped $Ga_yIn_{1-y}As$, the emitter layer comprises n-doped $Ga_xIn_{1-x}P$, and all isolating elements of the emitter layer and of the collector layer comprise $Ga_xIn_{1-x}P$ containing boron.

4. The heterojunction bipolar transistor as claimed in claim 1, wherein the collector layer comprises n-doped $Ga_yIn_{1-y}As$, the base layer comprises p-doped $Ga_yIn_{1-y}As$, the emitter layer comprises n-doped $Ga_yIn_{1-x}P$, collector isolating elements comprise $Ga_yIn_{1-y}As$ containing boron, and emitter isolating elements comprise $Ga_xIn_{1-x}P$ containing boron.

5. The heterojunction bipolar transistor as claimed in claim 1, further comprising, between the emitter layer and the base layer, or between the base layer and the collector layer, a spacer layer formed from a succession of layers of n-doped $Ga_xIn_{1-x}P$ and of $Ga_yIn_{1-y}As$.

6. A collector-up heterojunction bipolar transistor comprising, stacked on a substrate:
   an emitter layer;
   a base layer; and
   a collector layer, wherein
   a surface area of a base-emitter junction is of a smaller size than a surface area of a base-collector junction,
   a material of the base layer exhibits a sensitivity of electrical conductivity to ion implantation which is lower than a sensitivity of electrical conductivity of the material of the emitter layer relative to a same ion implantation, and
   the collector layer comprises, on its surface, an ohmic contact layer comprising refractory metal of TiWSi, WN or TiW type.

7. The heterojunction bipolar transistor as claimed in claim 5, further comprising a semiconducting thin film for passivation formed between the base layer and the collector layer or between the spacer layer and the collector layer.

8. A collector-up heterojunction bipolar transistor comprising, stacked on a substrate:
   an emitter layer;
   a base layer;
   a collector layer; and
   a passivation layer covering over a whole of a relief of the transistor, wherein
   a surface area of a base-emitter junction is of a smaller size than a surface area of a base-collector junction, and
   a material of the base layer exhibits a sensitivity of electrical conductivity to ion implantation which is lower than a sensitivity of electrical conductivity of the material of the emitter layer relative to a same ion implantation.

9. The heterojunction bipolar transistor as claimed in claim 8, further comprising a heat sink having a bridge shape that rests on a part of the relief of the transistor and on the substrate.

10. The heterojunction bipolar transistor as claimed in claim 8, further comprising a sink in contact with a whole of a component and coupled thermally to the substrate.

11. A method of manufacturing a collector-up heterojunction bipolar transistor including epitaxial growth of semiconducting layers on a semiconductor substrate, said bipolar transistor including an emitter layer; a base layer; and a collector layer, wherein materials of the base layer and of the emitter layer are chosen such that the material of the base layer exhibits a sensitivity of electrical conductivity to ion implantation which is lower than a sensitivity of electrical conductivity of the emitter layer to a same ion implantation, and
   said method of manufacturing said bipolar transistor comprising:
   producing a first mask on the collector layer having a width ($l_c$) corresponding to a width of the collector to be formed;
   then carrying out a first ion implantation isolated on either side of the emitter to form the material of the emitter layer; and
   then carrying out a second ion implantation isolated on either side of the collector using an energy that is lower than an energy of the first ion implantation, to form the material of the collector layer.

12. The method of producing a heterojunction bipolar transistor as claimed in claim 11, wherein the transistor is based on III-V materials and comprises the epitaxial growth of semiconductor layers in which the base layer is a first conductivity type layer and is formed between the emitter and collector layers, which are two layers of a second conductivity type, said method further comprising:
   performing the first ion implantation through the first mask on an upper layer situated above the base layer to define electrically isolating elements on either side of a first doped semiconductor element having a width $L_{BC}$;
   performing the second ion implantation through the same mask on a lower layer situated below the base layer to define electrically isolating elements on either side of a second doped semiconductor element having a width $L_{EB}$, which is less than $L_{BC}$;
   etching, through a second mask having a width $L_c > l_c$, of the upper layer to produce a mesa that defines a geometry of isolating wells created previously by the first ion implantation; and
   etching, through a third mask having a width greater than $L_c$, of the lower layer to produce a mesa that defines a geometry of isolating wells created previously by the second ion implantation.

13. The method of producing a heterojunction bipolar transistor as claimed in claim 12, wherein the upper and base layers have different behaviors relative to an ion implantation.

14. The method of producing a heterojunction bipolar transistor as claimed in claim 13, wherein the lower layer comprises n-doped $Ga_xIn_{1-x}P$, the base layer comprises p-doped $Ga_yIn_{1-y}As$, and the upper layer comprises n-doped $Ga_xIn_{1-x}P$ or n-doped $Ga_yIn_{1-y}As$.

15. The method of producing a heterojunction bipolar transistor as claimed in claim 12, wherein the first mask having the width $l_c$ comprises a metal of the Ti/Au or Ti/Pt/Au type.

16. The method of producing a heterojunction bipolar transistor as claimed in claim 12, wherein the first mask having the width $l_c$ comprises a resin.

* * * * *